United States Patent [19]

Hoffmeyer et al.

[11] Patent Number: 5,632,438

[45] Date of Patent: May 27, 1997

[54] DIRECT CHIP ATTACHMENT PROCESS AND APPARATUS FOR ALUMINUM WIREBONDING ON COPPER CIRCUITIZATION

[75] Inventors: Mark K. Hoffmeyer; Gregg A. Knotts, both of Rochester; Connie J. Mathison, Pine Island, all of Minn.

[73] Assignee: International Business Machines Corporation, Armonk, N.Y.

[21] Appl. No.: 541,256

[22] Filed: Oct. 12, 1995

[51] Int. Cl.$^6$ .................................... H01L 21/603
[52] U.S. Cl. .................... 228/180.5; 228/207; 228/4.5
[58] Field of Search .................... 228/111, 180.5, 228/207, 4.5, 33

[56] References Cited

U.S. PATENT DOCUMENTS

| | | | |
|---|---|---|---|
| 777,546 | 12/1904 | Schaap | 228/206 |
| 3,735,484 | 5/1973 | Gurev et al. | 29/588 |
| 4,087,367 | 5/1978 | Rioult et al. | 252/79.1 |
| 4,226,640 | 10/1980 | Bertholdt | 134/3 |
| 4,435,253 | 3/1984 | Baker et al. | 204/43 G |
| 4,452,643 | 6/1984 | Martin et al. | 134/3 |
| 4,800,178 | 1/1989 | Mather et al. | 204/44 |
| 5,248,525 | 9/1993 | Siebert | 106/14.12 |
| 5,331,495 | 7/1994 | Yoshida et al. | 29/603 |

OTHER PUBLICATIONS

JAPIO document, 91-285385, "Manufacture of Ceramic Electronic Circuit Board", PN JP03-285385, Dec. 16,1991.

*Primary Examiner*—Samuel M. Heinrich
*Attorney, Agent, or Firm*—Joan Pennington

[57] ABSTRACT

A direct chip attachment process and apparatus for aluminum wirebonding on copper circuitization are provided. After at least one integrated circuit chip is attached to a carrier, an aqueous cleaning solution containing citric and oxalic acid based additives is applied to the carrier and attached integrated circuit chip. Then a deionized water rinse is applied to the carrier and attached integrated circuit chip, followed drying for a set time period. Next wirebonding on copper circuitization carried by the carrier is performed.

15 Claims, 3 Drawing Sheets

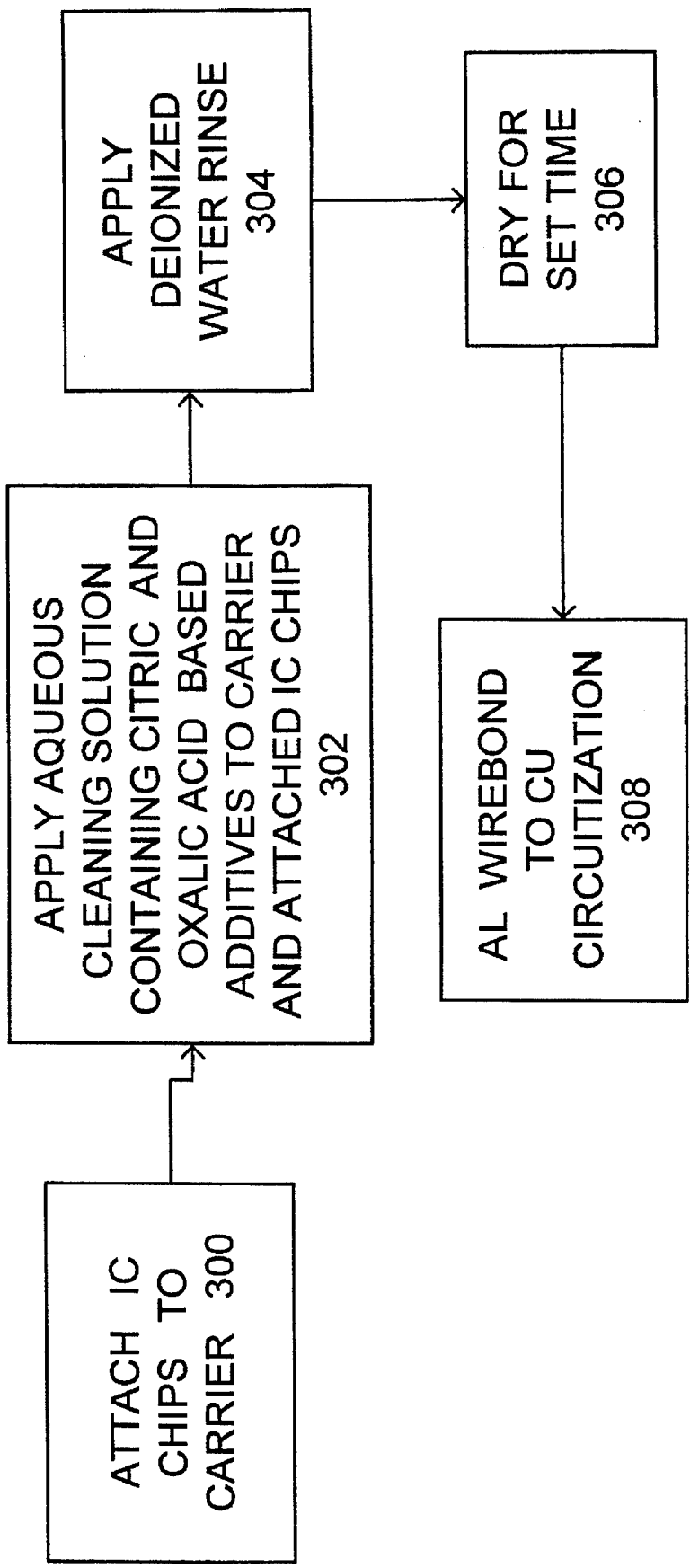

DIRECT CHIP ATTACHMENT PROCESS AND APPARATUS FOR ALUMINUM WIREBONDING ON COPPER CIRCUITIZATION

FIELD OF THE INVENTION

The present invention relates to a direct chip attachment process and apparatus for aluminum wirebonding on copper circuitization, and more particularly to a method and apparatus for cleaning copper circuitization after the integrated circuit chips have been attached to a carrier supporting copper circuits for providing high yield, high reliability aluminum wirebonding on the carrier.

DESCRIPTION OF THE PRIOR ART

Referring to FIG. 1, there is shown a prior art direct chip attachment (DCA) configuration with wirebonds 10 on conventional overplated, overcoated copper (Cu) pads 12. Typically, costly platings 14 are required on circuit carriers 16 possessing direct chip attach (DCA) wirebonded integrated circuit (IC) chips 20 and wirebond jumper circuits to perform high yield wirebonding on carriers possessing copper circuits. The IC chips 20 are attached to the circuit carrier 16 with an adhesive or solder chip attach material 22 using heat. A circuit covercoat or solder mask 24 covers the copper circuits. In most direct chip attach (DCA) wirebond operations, silicon chips 20 are wirebonded to interconnection pads 12 on circuit carriers 16 that commonly possess a combination of barrier underplatings and noble or semi-noble metal overplate finishes or surface coatings 14. The most common layered surface finish metallurgies for circuit carrier wirebonding applications consist of a nickel (Ni) underplating coating covered by a surface overplating coating layer 14 of gold (Au), palladium (Pd), or silver (Ag). These layered surface finish treatments inhibit diffusion of the underlying copper (Cu) circuit metallization to the surface of the overplate and thus prevent subsequent oxidation of the wirebond pad surfaces. Significant oxidation of pad surfaces 12 prior to wirebonding otherwise can result in both inability to wirebond with high yield and deterioration of ultimate wirebond interconnection reliability. Use of these overplating treatments on copper pads has been used to effectively provide both high yield and high reliability wirebond interconnections.

Such plating treatments can be quite costly, due to precious metal content and strict process controls required on plating bath chemistries. Moreover, when using electrolytic plating, bussing configurations must be provided to all areas requiring a plating treatment. The required bussing usually compromises more efficient wiring configurations and can also prevent maximum usage of available carrier space in both panel and circuit designs. The electrolytic platings can result in higher circuit piece price costs due to inefficient packing of multi-microprocessor circuit configurations on panelized carrier materials including flexible carrier materials, such as polyimide, polyester, and rigid carrier materials, such as a glass epoxy composite or FR4, ceramic, liquid crystal polymer (LCP), and the like.

Other known plating processes that are not electrolytic provide solutions which eliminate the need for the otherwise required bussing; however, these processes are in general more costly to use due to the additional requirements of continual bath replenishment, strict plating chemistry, and plating parameters control. Increased manufacturing costs also result from the slow plating rates achieved in standard industrial practice.

A need exists for an improved direct chip attachment process for aluminum wirebonding on copper circuitization. It is desirable to provide such improved direct chip attachment process for aluminum wirebonding on copper circuitization that eliminates the need for plating treatments.

SUMMARY OF THE INVENTION

Important objects of the present invention are to provide an improved direct chip attachment process and apparatus for aluminum wirebonding on copper circuitization; to provide such process and apparatus for aluminum wirebonding on copper circuitization that eliminates the need for plating treatments; and to provide such process and apparatus for aluminum wirebonding on copper circuitization that overcomes many of the disadvantages of prior art arrangements.

In brief, a direct chip attachment process and apparatus for aluminum wirebonding on copper circuitization are provided. After at least one integrated circuit chip is attached to a carrier, an aqueous cleaning solution containing citric and oxalic acid based additives is applied to the carrier and attached integrated circuit chip. Then a rinse is applied to the carrier and attached integrated circuit chip, followed by drying for a set time period. Next wirebonding on copper circuitization carried by the carrier is performed.

BRIEF DESCRIPTION OF THE DRAWING

The present invention together with the above and other objects and advantages may best be understood from the following detailed description of the preferred embodiments of the invention illustrated in the drawings, wherein:

FIG. 3 is a process flow diagram illustrating apparatus for performing sequential steps of the process of the present invention.

DETAILED DESCRIPTION OF THE PREFERRED EMBODIMENTS

Figure 1:
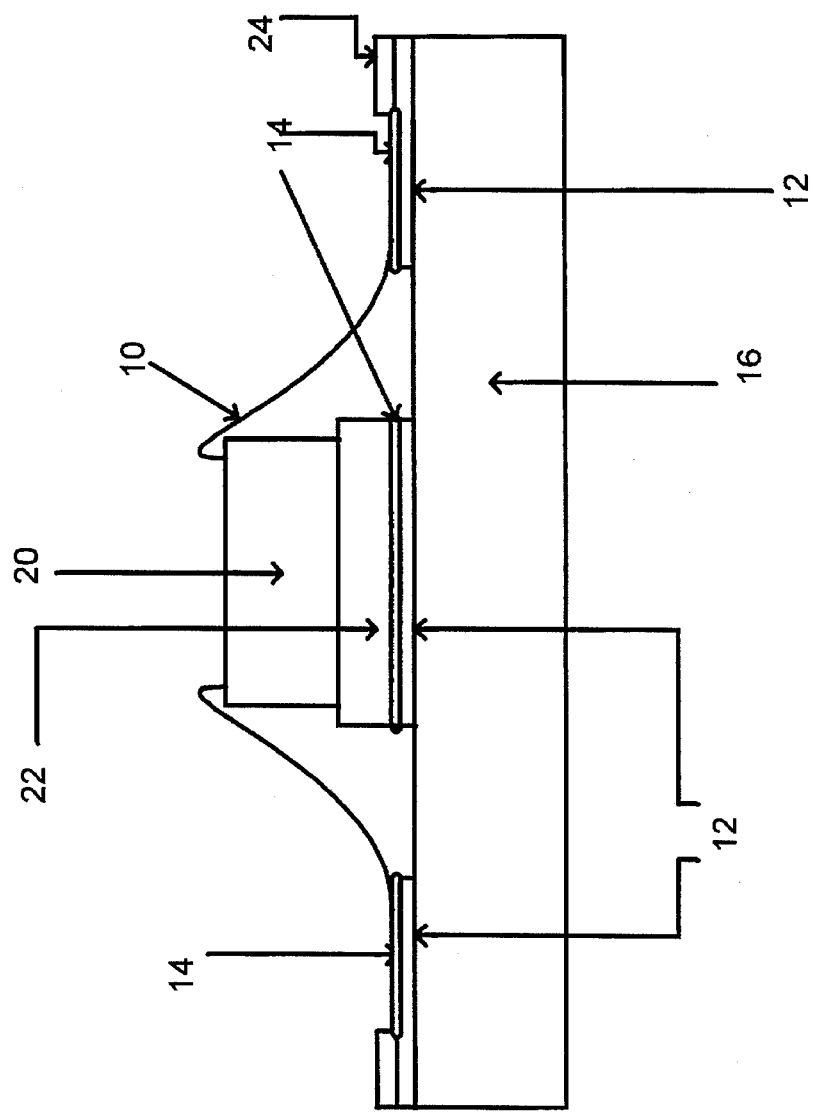
FIG. 1 is a schematic view illustrating a prior art direct chip attachment (DCA) structure including platings over copper pads.
Figure 2:
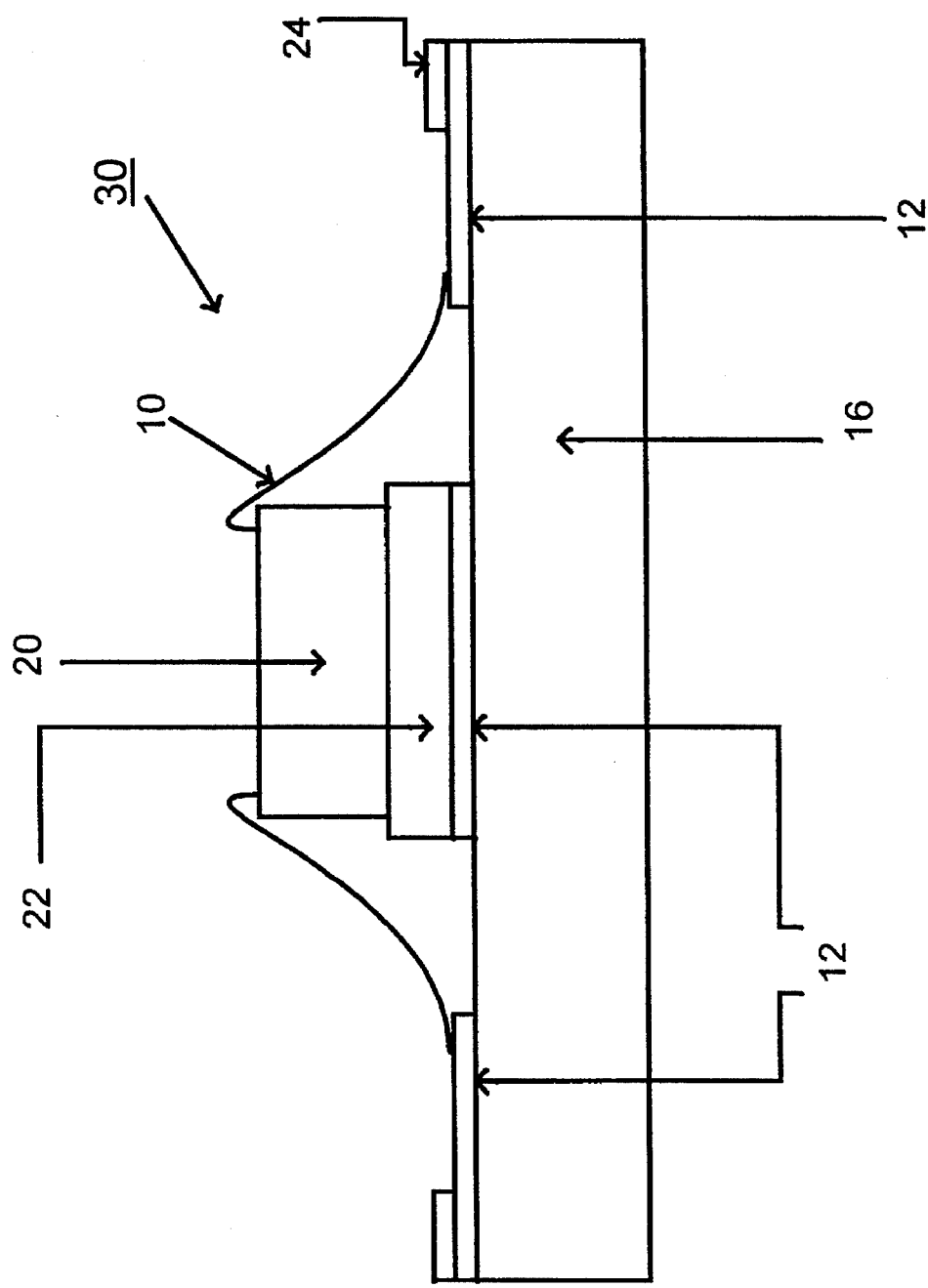
FIG. 2 is a schematic view illustrating a direct chip attachment (DCA) structure embodying the present invention.

Having reference to FIG. 2, there is shown a direct chip attachment (DCA) structure generally designated by 30 in accordance with the present invention. Identical reference characters are used for similar components of the prior art DCA configuration of FIG. 1. DCA structure 30 for performing a DCA attachment process of the invention eliminates the need for costly platings 14 required for high yield, high reliability wirebonding prior art configuration of FIG. 1.

The present invention performed after the attachment of the IC dice or chip 20, is a cleaning method compatible with the components 20, chip attaching material 22, carrier 16, and any other components (not shown) present on the circuit carrier. The requirements for successful wirebonding to copper have been achieved utilizing an aqueous based immersion or spray cleaning solution containing a mixture of citric and oxalic acid based additives. The bare copper wirebond circuit carrier pads 12 are cleaned by the process of the invention to facilitate high reliability, high yield DCA wirebonding on bare copper (Cu) circuitization of FIG. 2. As in conventional DCA wirebond applications, the IC chips 20 are mounted to carrier surfaces 12 via the chip attach material 22 using soldering processes or adhesive attaching operations. Either soldering or adhesive attaching operations requires that heat be applied during the dice-attaching step to insure either adequate solder reflow or effective cure of the chip adhesive. During these heating operations, when noble overplatings 14 are not used, significant oxidation of the exposed copper circuitization will occur and must be removed in order to provide for high reliability, high yield wirebonding in manufacturing. The oxide removal process of the invention is compatible with all materials of the DCA structure 30 comprising the base carrier 16, the components 20, component attach materials 22, and any other components (not shown) present on the carrier at the time of oxide removal.

Referring to FIG. 3, there is shown a process flow chart illustrating sequential functional blocks for performing the process of the present invention. After the semiconductor chip is affixed to a carrier 16 as indicated at a block 300, the carrier 16 and attached components 20 are immersed in a bath, or exposed to a spray of the cleaning solution for a set time period, for example less than 1 minute to a few minutes, as indicated at a block 302. Next as indicated at a block 304, a deionized (DI) water rinse is applied and followed by drying for a predetermined time period as indicated at a block 306. Then the wirebonding step is performed as indicated at a block 308.

The cleaning treatment of the invention effectively removes copper based oxides and protective copper treatments without attacking carrier materials, such as polyimide, polyester, the glass epoxy composite or FR4, ceramic, liquid crystal polymer (LCP), and other materials present on the carrier 16 including, for example, solder, chip passivations, solder masks, chip adhesives, component molding compounds and the like. For example, organic protective copper coating treatments that contain active ingredients, such as benzotriazole and benzoimidazole, or other organic modifiers, are removed by the cleaning treatment of the invention. Examples of commercially available organic copper coating treatments include formulations manufactured and sold by Enthone under the marks ENTEK Cu-56 and ENTEK PLUS Cu-106A. After exposure to the cleaning process, high yield wirebonding to copper circuits can be achieved. However, strict control on cycle time to wirebond after cleaning must be maintained to insure high yield, high reliability wirebond characteristics. This turn around time (TAT) process requirement is needed due to the fact that copper oxide growth will reinitiate on the cleaned copper surfaces and can grow to a thickness which impacts wirebonding even at room temperature within a predetermined time period, such as 24 hours after completion of the cleaning process. For example, the wirebonding at block 308 should preferably occur within 18 hours of the cleaning operation at block 302.

Preliminary aluminum wirebonding investigations performed on both FR4 coupons and on flex circuitry possessing direct chip attached silicon chips and copper circuitization show that extremely high wirebond yields can be made within an approximate 24 hour time period after cleaning. This TAT is more than adequate for most high volume DCA manufacturing. Wirebond pull test data taken from the experimental parts also show that no significant changes in wirepull strength or in wirepull failure modes are observed if the bonding is performed within this time period after cleaning as well. Equally important is the fact that the wirebond pull strength is also comparable to chips wirebonded to conventional nickel (Ni), gold (Au) plated control samples. Also important to long term reliability is the behavior and stability of the metallurgical interface created between copper pads 12 and the Al wires 10. For this metallurgical system, the formation of an $AlCu_2$ intermetallic compound (IMC) is anticipated. Because all IMC's are brittle, if allowed to grow to significant thickness, bond integrity during field power on-off cycling can be compromised due to interfacial fracture which occurs at the intermetallic layer(s). However, it is known that the growth rate for $AlCu_2$ is much slower than for Al-Au and Al-Ni compounds normally formed at wirebond interfaces on Ni/Au plated carriers. Thus, bonding to copper can actually provide for more stable metallurgical wirebond interfaces in a wider range of performance applications. From a manufacturing perspective, use of the technique is also promising since only modest changes in wirebond tool parameters are required to achieve similar results on Cu as compared to Ni/Au plated metallurgies. This data indicates that the process conditions required to bond on copper are easily provided using most/all standard commercial wirebonding equipment.

It should be understood that the present invention can be used with many common packages including, plastic quad flat packs (PQFPs), thin solid outline packages (TSOPs), plastic leaded chip carriers (PLCCs), dual inline packages (DIPs) and single in-line packages (SIPs).

An example for DCA wirebonding on copper of the invention follows:

Copper coupons were annealed for 6 hours at 150° C. to simulate DCA preparations normally used for attachment of IC chips. This annealing treatment induces copper oxide layer buildup which must be removed to achieve a surface that can be wirebonded.

After exposure to the annealing treatment, the copper coupons were immersed in an aqueous solution containing oxalic and citric acid based additives and removed for wirebond test evaluation. A 60 second immersion with mild part agitation of coupons in a mixture of 1000 ml distilled, deionized water containing 2 g citric acid monohydrate $HOC(CDOH)(CH_2COOH)_2 \cdot H_2O$ and 4 g oxalic acid $H_2C_2O_4 \cdot 2H_2O$ provided excellent oxide removal from the Cu coupon surfaces and resulted in ability to achieve strong, high yield aluminum wirebonding onto coupon surfaces.

While the present invention has been described with reference to the details of the embodiments of the invention shown in the drawing, these details are not intended to limit the scope of the invention as claimed in the appended claims.

What is claimed is:

1. A direct chip attachment process for aluminum wirebonding on copper circuitization comprising the steps of:
    attaching at least one integrated circuit chip to a carrier;
    applying to the carrier and attached integrated circuit chip an aqueous cleaning solution containing citric and oxalic acid based additives;
    applying to the carrier and attached integrated circuit chip a rinse; and
    wirebonding on copper circuitization carried by the carrier.

2. A direct chip attachment process as recited in claim 1 wherein the step of applying to the carrier and attached integrated circuit chip an aqueous cleaning solution containing citric and oxalic acid based additives includes the step of providing an aqueous spray cleaning solution and exposing the carrier and attached integrated circuit chip to the aqueous spray cleaning solution for a predefined time period.

3. A direct chip attachment process as recited in claim 1 wherein the step of applying to the carrier and attached integrated circuit chip an aqueous cleaning solution containing citric and oxalic acid based additives includes the step of providing an aqueous immersion bath cleaning solution and immersing the carrier and attached integrated circuit chip in the aqueous immersion bath cleaning solution for a predefined time period.

4. A direct chip attachment process as recited in claim 2 wherein the predefined time period is selectively provided as a non-zero value less than five minutes.

5. A direct chip attachment process as recited in claim 3 wherein the predefined time period is selectively provided as a non-zero value less than five minutes.

6. A direct chip attachment process as recited in claim 1 wherein the step of applying to the carrier and attached integrated circuit chip an aqueous cleaning solution containing citric and oxalic acid based additives includes the step of providing a mixture based upon 1000 ml distilled, deionized water containing 2 g citric acid monohydrate $HOC(CDOH)(CH_2COOH)_2\text{-}H_2O$ and 4 g oxalic acid $H_2C_2O_4 \cdot 2H_2O$.

7. A direct chip attachment process as recited in claim 1 wherein the step of applying to the carrier and attached integrated circuit chip a rinse includes the step of applying a deionized water rinse.

8. A direct chip attachment process as recited in claim 1 further includes the step of drying the carrier and attached integrated circuit chip for a predetermined time period before the wirebonding step.

9. A direct chip attachment process as recited in claim 8 wherein the predetermined time period for drying is less than 24 hours.

10. Apparatus for cleaning copper circuitization after one or more integrated circuit chips have been attached to a carrier supporting copper circuits comprising:

means for applying to the carrier and attached integrated circuit chip an aqueous cleaning solution containing citric and oxalic acid based additives;

means for applying to the carrier and attached integrated circuit chip a rinse;

means for drying the carrier and attached integrated circuit chip for a predefined time period; and means for wirebonding on the copper circuitization carried by the carrier.

11. Apparatus for cleaning copper circuitization as recited in claim 10 wherein said means for applying to the carrier and attached integrated circuit chip an aqueous cleaning solution containing citric and oxalic acid based additives include an immersion bath.

12. Apparatus for cleaning copper circuitization as recited in claim 10 wherein said means for applying to the carrier and attached integrated circuit chip an aqueous cleaning solution containing citric and oxalic acid based additives include a spray station.

13. Apparatus for cleaning copper circuitization as recited in claim 10 wherein said means for applying to the carrier and attached integrated circuit chip an aqueous cleaning solution containing citric and oxalic acid based additives include means for identifying a set time period for applying the aqueous cleaning solution.

14. Apparatus for cleaning copper circuitization as recited in claim 10 wherein said means for applying to the carrier and attached integrated circuit chip an aqueous cleaning solution containing citric and oxalic acid based additives include means for identifying a set time period selectively provided as a non-zero value less than five minutes.

15. Apparatus for cleaning copper circuitization as recited in claim 10 wherein said means for drying the carrier and attached integrated circuit chip for a predefined time period includes means for identifying a predefined time period of less than or equal to 24 hours.

* * * * *